(12) United States Patent
Evans et al.

(10) Patent No.: US 7,363,894 B2
(45) Date of Patent: *Apr. 29, 2008

(54) SWITCHABLE VALVE-DRIVE COMPONENT

(75) Inventors: Matthew Evans, Warren, MI (US);
 Jermel Jones, Southfield, MI (US);
 Peter Sailer, Erlangen (DE); Oliver Schnell, Veitsbronn (DE); Tim Matthias Hosenfeldt, Ebern (DE)

(73) Assignee: Schaeffler KG, Herzogenaurach (DE)

( * ) Notice: Subject to any disclaimer, the term of this patent is extended or adjusted under 35 U.S.C. 154(b) by 61 days.

This patent is subject to a terminal disclaimer.

(21) Appl. No.: 11/375,348

(22) Filed: Mar. 14, 2006

(65) Prior Publication Data

US 2006/0225682 A1  Oct. 12, 2006

Related U.S. Application Data

(60) Provisional application No. 60/670,559, filed on Apr. 11, 2005.

(51) Int. Cl.
 *F01L 1/34* (2006.01)
(52) U.S. Cl. .............. 123/90.16; 123/90.39; 123/90.44; 123/90.48; 74/569
(58) Field of Classification Search ............. 123/90.16, 123/90.2, 90.39, 90.44, 90.48, 90.52, 90.55; 74/567, 569
 See application file for complete search history.

(56) References Cited

U.S. PATENT DOCUMENTS 6,595,174 B2 * 7/2003 Schnell ............... 123/90.55
6,904,935 B2 * 6/2005 Welty et al. ........... 137/625.17
6,969,198 B2 * 11/2005 Konishi et al. ............... 384/13
2005/0098134 A1 * 5/2005 Nishimura et al.

FOREIGN PATENT DOCUMENTS

| DE | 44 04 145 | 8/1995 |
|----|-----------|--------|
| DE | 102 04 673 | 8/2003 |
| WO | 2004/094791 | 11/2004 |
| WO | 2004/109068 | 12/2004 |

OTHER PUBLICATIONS

"Verbrennungsmotor" ["Internal Combustion Engine"], first edition published in Apr. 2002 by Vieweg-Verlag; Chapter 10.4.2, pp. 357-359.
"Nockenwellenverstellungen für Ottomotoren" ["Camshaft Adjustments for Otto Engines"], published 2002 by Verlag Moderne Indsutrie, pp. 44-47.

* cited by examiner

*Primary Examiner*—Ching Chang
(74) *Attorney, Agent, or Firm*—Volpe and Koenig, P.C.

(57) ABSTRACT

A switchable valve-drive component (1) for variable transmission of a stroke generated by one or more cam projections to a gas-exchange valve of an internal combustion engine is provided. The valve-drive component (1) has transmission elements (3, 4), which can be connected with a positive fit by coupling elements (8) in the transmission direction, in which force transmission surface sections (16) of the coupling elements (8) can be clamped between force transmission surface sections (20) of the transmission elements (3, 4). Here, at least one of the force transmission surface sections (16, 20) should be provided with a wear protection layer (23). This layer comprises at least one metal-free amorphous hydrocarbon layer with $sp^2$-hybridized and $sp^3$-hybridized carbon.

6 Claims, 2 Drawing Sheets

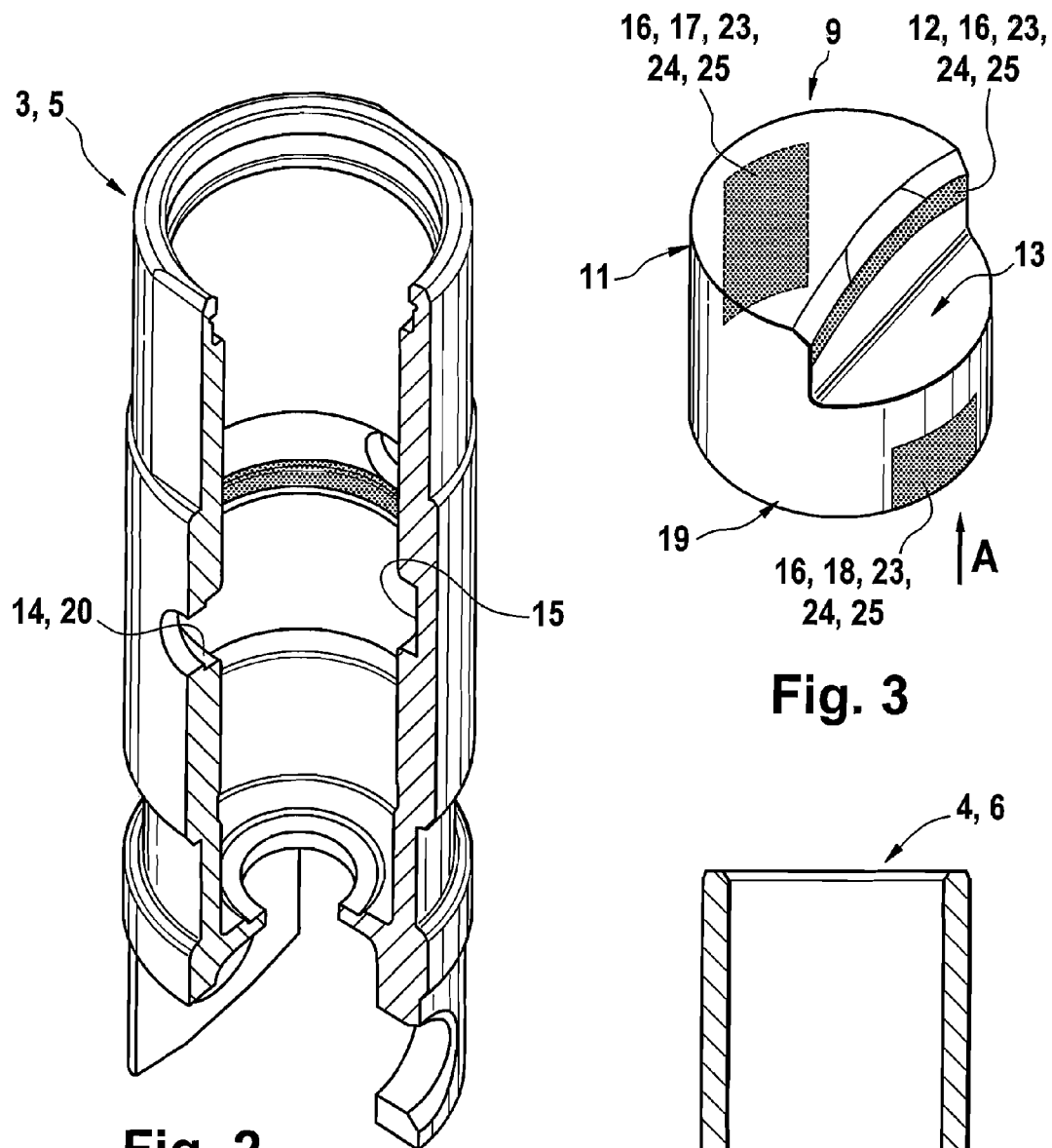
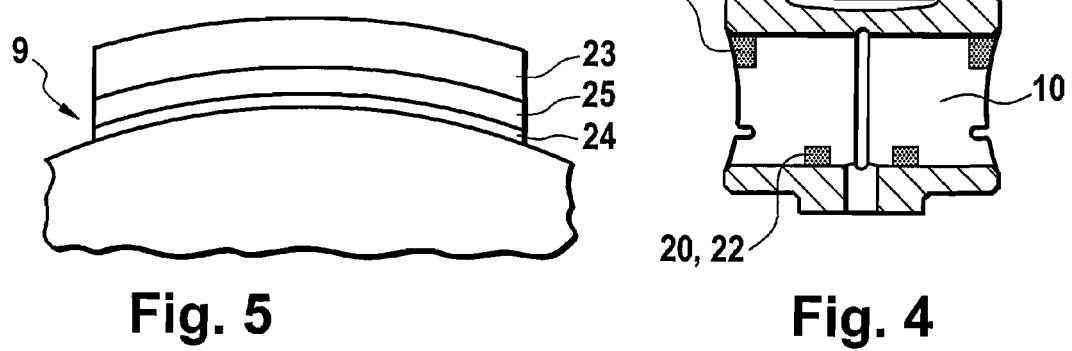

SWITCHABLE VALVE-DRIVE COMPONENT

CROSS-REFERENCE TO RELATED APPLICATIONS

This application claims the benefit of U.S. Provisional Application No. 60/670,559, which was filed on Apr. 11, 2005.

FIELD OF THE INVENTION

The present invention relates to a switchable valve-drive component for variable transmission of a stroke generated by one or more cam projections to at least one gas-exchange valve of an internal combustion engine. The valve-drive component has at least two transmission elements, which can be connected with a positive fit by one or more coupling elements in the transmission direction, in that force-transmission surface sections of the coupling elements can be clamped between force-transmission surface sections of the transmission elements.

BACKGROUND OF THE INVENTION

Valve-drive components according to this general type are known in the state of the art as effective means for targeted optimization of the fuel consumption, power behavior, and exhaust-gas emissions of internal combustion engines. Such valve-drive components typically have coupling elements, which can be displaced depending on the operating point and with which the transmission elements of the valve-drive components can be connected with a positive fit in the transmission direction.

To be included here is the switchable cam follower arranged in the flow of forces between a camshaft of the internal combustion engine and the gas-exchange valves. With this cam follower, discrete cam projections tuned to the operating state of the internal combustion engine can be transferred selectively to a gas-exchange valve or can be completely canceled out for making the gas-exchange valve stationary. A good overview of switchable cam followers can be obtained by someone skilled in the art with, for example, the manual "Verbrennungsmotor" ["Internal Combustion Engine"], first edition published in April 2002 by Vieweg-Verlag. There, in Chapter 10.4.2, Page 357 and on, systems configured for sequential use are described with step-wise stroke and opening period duration of the gas-exchange valve. Switchable finger levers and rocker arms, as well as a switchable cup tappets, which provide hydraulically activated coupling elements for locking the transmission elements and which are used for switching or deactivating the gas-exchange valves. Furthermore, a switchable rocker arm in WO 2004/094791 and also a switchable roller tappet in DE 102 04 673 A1 for a tappet push-rod valve drive—both with hydraulically activated coupling elements—are proposed. Finally, a switchable cam follower is understood by someone skilled in the art to be a support element supported statically in the internal combustion engine, as proposed, for example, in DE 44 04 145 A1.

Furthermore, camshaft adjusters, which change the control times of gas-exchange valves and which have one or more coupling elements for locking a stator as a drive-side transmission element to a rotor as a driven-side transmission element, also belong to the valve-drive components according to this class. For hydraulically activated camshaft adjusters, such a coupling element maintains the control times necessary for the starting process of the internal combustion engine as a priority, because in this operating state, there is still not sufficient hydraulic means pressure for powering the camshaft adjuster. Additional details and configurations are described, for example, in the book "Nockenwellenverstellungen für Ottomotoren"[ "Camshaft adjustments for Otto engines"] on Page 44 and on. This book was published in the year 2002 by Verlag Moderne Industrie.

Finally, switchable camshafts are to be named, which provide cams with cam segments that can be adjusted relative to each other and that can be locked by means of coupling elements as transmission elements. Such a camshaft follows from, among other things, WO 2004/109068 A1.

All of the mentioned valve-drive components are based on the principle of connecting their transmission elements with a positive fit by coupling elements that can be displaced as a function of the operating point in the transmission direction. In reference to trouble-free functioning of the switchable valve-drive components over the service life of the internal combustion engine, the design of the coupling elements and their contact partners in the transmission elements are of the highest importance. Here, an essential objective is long-term smooth-running displacement of the coupling elements as a prerequisite for its reproducible switching process, which should also end within a cam base circle phase for switchable cam followers or switchable camshafts even at very high rpms and/or for a cold internal combustion engine with high-viscosity lubricating oil. For this purpose, hydraulically activated coupling elements are typically guided with a tight clearance fit, in order to generate a quick pressure build-up in front of the coupling elements, wherein due to the tight clearance fit, a minimal and minimally dispersive mechanical play can be simultaneously guaranteed within the switchable valve drive components. Because the opening course of the gas-exchange valves is changed relative to the associated cam projection by the mechanical play, another objective is to hold the mechanical play and its dispersion, especially for switchable cam followers, as constant as possible over the service life of the internal combustion engine, in order to generate the most uniform and constant opening courses of all of the gas-exchange valves of the internal combustion engine as possible. This is a prerequisite for long-term good idle running quality for the internal combustion engine, which reacts sensitively to changes of the control times of simultaneously opened inlet and outlet valves, especially at this operating point.

An essential prerequisite for the long-term smooth-running displacement and also the most constant mechanical play of the coupling elements as possible is the form and surface stability of the coupling elements and their contact partners in the transmission elements. In this respect, even very high surface loads may not lead to significant deformation or significant wear on the loaded surfaces. These surface stresses result initially from material stresses in the region of Hertzian stress contacts or in the region of edge carriers, which appear between coupling elements and transmission elements, for example, in the region of the parting lines between the transmission elements stressed by the coupling elements. Furthermore, dynamic loading of the coupling elements clamped between the transmission elements leads to mutual micro-movements of the involved surfaces, which results in a considerable risk of impermissibly high adhesive and/or abrasive wear for a lack of lubricating oil film and/or for a comparatively high content of abrasive particles in the lubricating oil. These particles can be, for example, soot particles as products of an incomplete combustion in the internal combustion engine, which leads via so-called blow-by into the crankcase and thus via the lubricating oil to the coupling elements.

Especially dynamic highly stressed switchable valve-drive components, such as, for example, cam followers with comparatively large moving mass, are exposed to this risk of wear and tear. To be counted here are primarily switchable roller tappets for tappet push-rod valve drives or also switchable finger levers, which can lead to impermissibly high wear and the progression of wear of the coupling elements and their contact partners in the transmission elements during the operation of the internal combustion engine. From the relevant state of the art cited as an example above, however, no means are known to the applicant for overcoming this problem under consideration of manufacturing and cost aspects of a large-series production.

SUMMARY

Therefore the objective of the present invention is to create a switchable valve-drive component, in which the coupling elements and also their contact partners are sufficiently well protected against adhesive wear and especially against abrasive wear.

According to the invention, this objective is met in that at least one of the force transmission surface sections is provided with a wear protection layer, which comprises at least one metal-free amorphous hydrocarbon layer with $sp^2$-hybridized and $sp^3$-hybridized carbon. The force transmission surface section coated with the amorphous hydrocarbon layer is characterized, in addition to the necessary wear resistance, also by a reduced coefficient of friction. This has the additional advantage that the displacement speed of the coupling elements can be increased further, so that even for very high rpms of the internal combustion engine with correspondingly short times of the cam base circle phase, a sufficiently fast and reproducible switching process of the valve-drive component can be guaranteed.

According to a preferred refinement of the invention, the amorphous hydrocarbon layer has a hydrogen percentage of a maximum of 16 Atom-% and process-specific contaminants, for example in the form of 0 or Ar atoms, metals, or the like, of less than 1 Atom-%. Therefore, force transmission surface sections provided with the wear protection layer feature a high abrasive wear resistance and a low adhesion tendency towards a metallic counter body in the form of a non-coated force transmission surface section. Simultaneously, such a hydrocarbon layer is characterized by high chemical resistance, high mechanical stability, and high hardness/modulus of elasticity ratios. A high hydrogen content could lead to undesired compounds with lubricants or the like.

Furthermore, the amorphous hydrocarbon layer should have a thickness of 0.8 µm to 2.5 µm. Here, according to another preferred embodiment, at least one bonding promotion layer and/or at least one intermediate layer can be provided between the force transmission surface section and the wear protection layer. The bonding promotion layer preferably comprises metallic materials, borides, carbides, and/or nitrides of the transition metals and has a thickness of approximately 0.1 µm to 0.5 µm. The intermediate layer is preferably comprised of W, Ti, Hf, Ge, or a combination of the previously mentioned components as a metal-bearing hydrocarbon layer and has a thickness of approximately 0.5 µm to 2.0 µm.

In an especially preferred embodiment of the invention, the valve-drive component shall be embodied as a roller tappet for switchable transmission of a cam projection to a tappet push-rod. Here, the transmission elements of the roller tappet are embodied as a hollow cylinder outer part and as a cylindrical inner part, which is supported so that it can move in the longitudinal direction in the outer part against the force of a lost-motion spring. Furthermore, the coupling elements are embodied as two partial cylindrical pistons, which are supported so that they can move in the longitudinal direction in a hollow cylindrical cross hole of the inner part and which each have a first axial end section facing the outer part with a flat contact surface with a step-shaped formation. In addition, the force transmission surface sections of each piston are formed, first, by the flat contact surface and, second, by a first outer shell section of the first axial end section of the piston, wherein this first shell section is radially opposite the contact surface, and finally by a second outer shell section of a second axial end section of the piston, wherein this second shell section is radially opposite the first outer shell section. Here, the wear protection layer should be provided exclusively on the pistons, wherein at least their force transmission surface sections are provided with the wear protection layer.

The switchable roller tappet is provided in this embodiment with sufficient wear resistance and cost efficiency, because the hydrocarbon layer is deposited merely on the piston with a relatively small surface. In addition, the outer force transmission surface sections of the piston are significantly more accessible to the coating systems for applying the wear protection layer than the inner force transmission surface sections, like the annular surface of the annular groove running within the outer part or the hollow cylinder cross holes of the inner part.

Finally, in an advantageous improvement of the invention, it is proposed that 16MnCr5 or 100Cr6 is provided as the material for the pistons. Here, the bonding promotion layer should comprise at least almost completely Cr and the intermediate layer should contain a maximum of 20% W and also a maximum of 20% H.

The invention is explained in more detail using the following embodiment.

BRIEF DESCRIPTION OF THE DRAWINGS

The invention is explained in more detail with reference to the enclosed drawings with a switchable roller tappet as an embodiment for the valve-drive component according to the invention. Shown are:

FIG. 2 is a perspective view of a longitudinally sectioned outer housing of the roller tappet, FIG. 3 is a perspective view of a piston of the roller tappet, FIG. 4 is a longitudinal section view of an inner part of the roller tappet, and FIG. 5 is a greatly enlarged representation of the section indicated at A in FIG. 3 with a coated force transmission surface section.

DETAILED DESCRIPTION OF THE PREFERRED EMBODIMENTS

Figure 1:
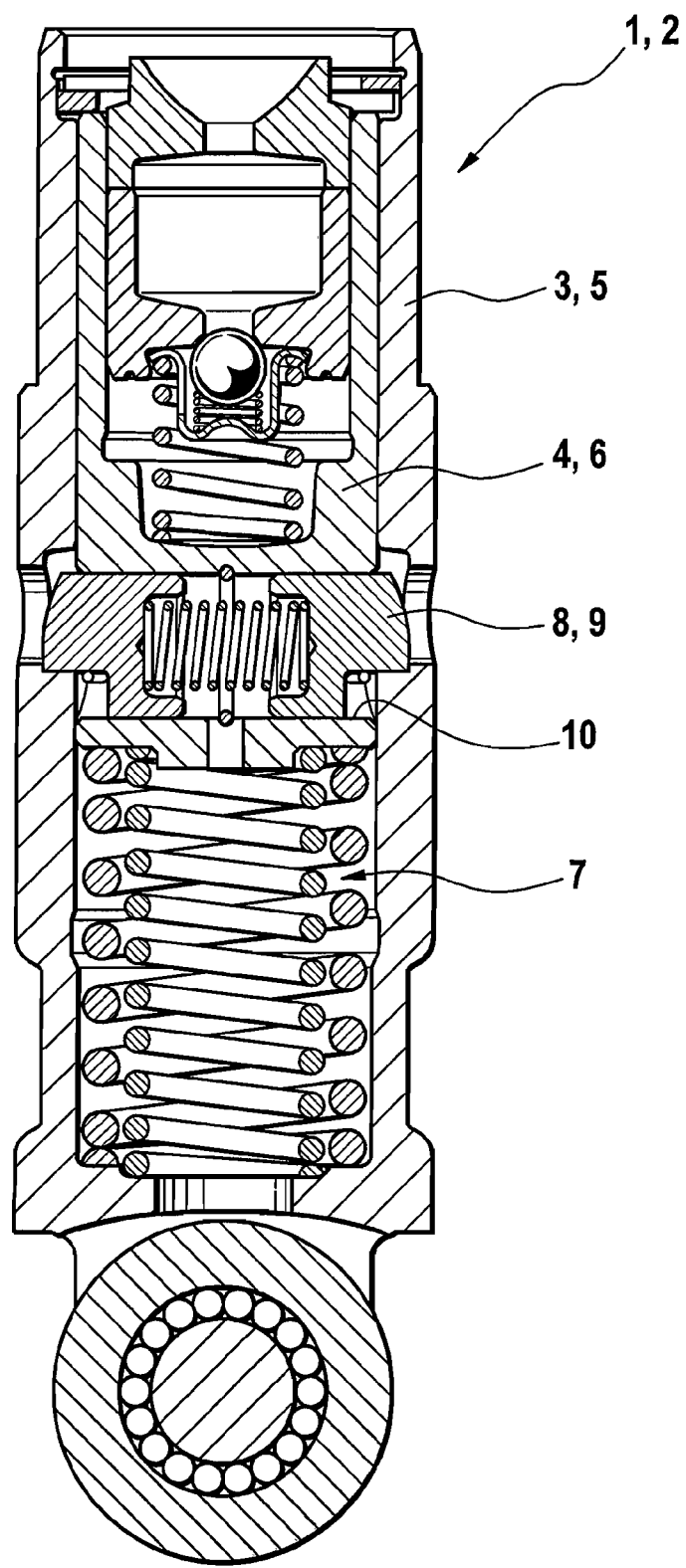
FIG. 1 is a longitudinal section view of the switchable roller tappet.

In the figures, the same reference symbols designate equivalent or functionally equivalent components, as long as nothing to the contrary is indicated.

FIG. 1 discloses a switchable valve-drive component 1, which is embodied here as a roller tappet 2 of a tappet push-rod valve drive with switchable transmission of a not-shown cam projection. A hollow cylindrical outer part 5 and a cylindrical inner part 6, which is supported so that it can move in the longitudinal direction in the outer part 5 against the force of a lost-motion spring 7 provided as a double spring, are used as transmission elements 3, 4 of the roller tappet 2. The inner part 6 and the outer part 5 can be connected to each other with a positive fit in the transmission direction via hydraulically controlled coupling elements 8. For this purpose, the coupling elements 8 are embodied as two partial cylindrical pistons 9, which are supported so that they can move in the longitudinal direction in a hollow cylinder cross-direction hole 10 of the inner part 6. Under subsequent consideration of FIGS. 2 to 4, each of the pistons 9 has a first axial end section 11 facing the outer part 5 with a flat contact surface 12 of a step-shaped formation 13. As long as the roller tappet 2 is located in the locked state according to FIG. 1 for transmitting the cam projection, the pistons 9 are periodically clamped with the cam projection between an annular surface 14 of an annular groove 15 running in the outer part 5 and the cross hole 10 of the inner part 6. Here, the dotted regions shown schematically in FIG. 3 act as force transmission surface sections 16 of the piston 9. In detail, these are the contact surface 12, a first outer shell section 17 radially opposite the contact surface 12 on the first axial end section 11, and also a second outer shell section 18 on a second axial end section 19 of the piston 9, wherein the second outer shell section 18 lies radially opposite the first outer shell section 17.

The force transmission surface sections 20 of the transmission elements 3, 4 corresponding with the appropriate force transmission surface sections 16 of a piston 9 are also shown dotted in FIGS. 2 and 4. The outer part 5 involves the annular surface 14 of the annular groove 15 and the inner part 6 involves an opening-side inner shell section 21 of the cross hole 10, on which the first outer shell section 17 of the piston 9 is supported, as well as an inner shell section 22 radially opposite the inner shell section 21 and supporting the second outer shell section 18 of the piston 9.

The periodic clamping of the piston 9 between the annular surface 14 and the cross hole 10 leads to mutual micro-movements of the force transmission surface sections 16, 20 involved in the transmission of the cam projection. In connection with a lack of lubricant oil film between the force transmission surface sections 16, 20 and/or for a comparatively high content of abrasive particles in the lubricating oil, the force transmission surface sections 16, 20 are consequently exposed to a considerable risk of impermissibly high adhesive and/or abrasive wear and tear.

For preventing this risk, a wear protection layer 23 is applied. Here, in the shown roller tappet 2 under consideration of manufacturing and cost aspects, it is possible to provide the wear protection layer 23 only for the pistons 9 and to eliminate the wear protection layer 23 for the force transmission surface sections 20 of the inner part 6 and the outer part 5. In addition, it can also be sufficient that only the force transmission surface sections 16 of the piston 9 are coated, whereby a sufficient wear protection both for the force transmission surface sections 16 of the piston 9 and also for the force transmission surface sections 20 of the outer part 5 and the inner part 6 is set. Nevertheless, especially depending on the geometry of the piston 9 and the specific formation of a coating system used for applying the wear protection layer 23, transfer regions running between the force transmission surface sections 16 can also be formed with layer thicknesses deviating from the wear protection layer 23.

In FIG. 5, the view A, which is pointing towards the second outer shell section 18 of the piston 9, is shown with greatly enlarged formation of the wear protection layer 23. The piston 9 comprises 100Cr6 or 16MnCr5 and is carbo-nitrided and tempered in the last case before the coating process. First, a bonding promotion layer 24 made from Cr is deposited on the piston 9. This is performed by means of a PVD method (Physical Vapor Deposition), wherein process-specific contaminants, for example, due to O or Ar atoms, metals, or the like of up to 1 Atom-% can be tolerated. The bonding promotion layer 24 has a thickness of 0.1 µm to 0.5 µm and is used for improved bonding of an intermediate layer 25 and the wear protection layer 23 to the force transmission surface sections 16.

The intermediate layer 25 is also deposited by means of a PVD method on the bonding promotion layer 24 and is formed as a metal-bearing hydrocarbon layer (Me-C:H) with a maximum of 20% W and a maximum of 20% H. The thickness of the intermediate layer 25 equals approximately 0.5 µm to 2.0 µm and is used for improved attachment of the wear protection layer 23 on the bonding promotion layer 24. The wear protection layer 23 is formed as an amorphous hydrocarbon layer (a-C:H) and is deposited preferably by means of a PVD and/or (PA)CVD method (Plasma Assisted Chemical Vapor Deposition) on the intermediate layer 25.

The entire layer built from the bonding promotion layer 24, the intermediate layer 25, and the wear protection layer 23 has a layer thickness of approximately 0.1 µm to 5.0 µm. Through such a layer thickness, the dimensions of the coated force transmission surface sections 16 and optionally 20 change by a small degree, so that no finishing is necessary and the set surface structure or topography of the coated surface is maintained. The amorphous hydrocarbon layer needs a subsequent heat treatment just as little. For the piston 9 coated in this way, the tribological problems, namely the wear resistance of the force transmission surface sections 16, 20 with simultaneous reduction of the coefficient of friction, are taken over by the wear protection layer 23, while the mechanical problems are taken over by the piston 9.

The low coefficient of friction of the wear protection layer 23 also leads to a significant reduction in friction of the piston 9 in favor of an increased displacement speed of the piston 9 within the cross hole 10 of the inner part 6. This guarantees a sufficiently fast and reproducible switching process for the roller tappet 2 even for high rpms of the internal combustion engine.

| List of reference symbols | |
|---|---|
| 1 | Valve-drive component |
| 2 | Roller tappet |
| 3 | Transmission element |
| 4 | Transmission element |
| 5 | Outer part |
| 6 | Inner part |
| 7 | Lost-motion spring |
| 8 | Coupling element |
| 9 | Piston |
| 10 | Cross hole |
| 11 | First axial end section |
| 12 | Contact surface |
| 13 | Formation |
| 14 | Annular surface |
| 15 | Annular groove |
| 16 | Force transmission surface section |
| 17 | First outer shell section |
| 18 | Second outer shell section |

-continued

List of reference symbols

| | |
|---|---|
| 19 | Second axial end section |
| 20 | Force transmission surface section |
| 21 | Inner shell section |
| 22 | Inner shell section |
| 23 | Wear protection layer |
| 24 | Bonding promotion layer |
| 25 | Intermediate layer |

The invention claimed is:

1. A switchable valve-drive component for variable transmission of a stroke generated by one or more cam projections to at least one gas-exchange valve of an internal combustion engine, comprising at least two transmission elements which can be connected with a positive fit by one or more coupling elements in a transmission direction, wherein force transmission surface sections of the coupling elements can be clamped between force transmission surface sections of the transmission elements, at least one of the force transmission surface sections is provided with a wear protection layer, which comprises at least one metal-free amorphous hydrocarbon layer with $sp^2$-hybridized and $sp^3$-hybridized carbon, wherein at least one bonding promotion layer and/or at least one intermediate layer is provided between the one or more force transmission surface sections and the wear protection layer, wherein the at least one intermediate layer is formed from metal-bearing hydrocarbon layers, whose metal components comprise W, Ti, Hf, Ge, or a combination thereof, and have a thickness of approximately 0.5 µm to 2.0 µm.

2. The valve-drive component according to claim 1, wherein the amorphous hydrocarbon layer has a hydrogen content of a maximum of 16 Atom-% and process-specific contaminants of less than about 1 Atom-%.

3. The valve-drive component according to claim 1, wherein the amorphous hydrocarbon layer has a thickness of approximately 0.8 µm to 2.5 µm.

4. The valve-drive component according to claim 1, wherein the at least one bonding promotion layer comprises metallic materials, borides, carbides, and/or nitrides of the transition metals and has a thickness of approximately 0.1 µm to 0.5 µm.

5. The valve-drive component according to claim 1, wherein the valve-drive component is formed as a roller tappet for switchable transmission of a cam projection to a tappet push-rod and includes:

the transmission elements which comprise a hollow cylindrical outer part and a cylindrical inner part, which is supported so that it can move in a longitudinal direction in the outer part against a force of a lost-motion spring;

the coupling elements which are comprised of two partial cylindrical pistons, which are supported so that they can move in a longitudinal direction in a hollow cylindrical cross hole in the inner part and which each have a first axial end section facing the outer part with a flat contact surface having a step-shaped formation;

the force transmission surface sections of each of the pistons are formed by the flat contact surface, by a first outer shell section of the first axial end section, wherein the first shell section is radially opposite the contact surface, and also by a second outer shell section of a second axial end section of the piston, wherein the second shell section is radially opposite the first outer shell section; and the wear protection layer is provided exclusively on the piston, wherein at least the force transmission surface sections of the piston are provided with the wear protection layer.

6. A switchable valve-drive component for variable transmission of a stroke generated by one or more cam projections to at least one gas-exchange valve of an internal combustion engine, comprising at least two transmission elements which can be connected with a positive fit by one or more coupling elements in a transmission direction, force transmission surface sections of the coupling elements can be clamped between force transmission surface sections of the transmission elements, at least one of the force transmission surface sections is provided with a wear protection layer which comprises at least one metal-free amorphous hydrocarbon layer with $sp^2$-hybridized and $sp^3$-hybridized carbon, at least one bonding promotion layer and at least one intermediate layer are provided between the one or more force transmission surface sections and the wear protection layer, the bonding promotion layer comprises at least almost completely Cr and the intermediate layer contains a maximum of 20% W and also a maximum of 20% H, wherein the valve-drive component is formed as a roller tappet for switchable transmission of a cam projection to a tappet push-rod and includes:

the transmission elements which comprise a hollow cylindrical outer part and a cylindrical inner part, which is supported so that it can move in a longitudinal direction in the outer part against a force of a lost-motion spring;

the coupling elements which are comprised of two partial cylindrical pistons formed of 16MnCr5 or 100Cr6 which are supported so that they can move in a longitudinal direction in a hollow cylindrical cross hole in the inner part and which each have a first axial end section facing the outer part with a flat contact surface having a step-shaped formation;

the force transmission surface sections of each of the pistons are formed by the flat contact surface, by a first outer shell section of the first axial end section, wherein the first shell section is radially opposite the contact surface, and also by a second outer shell section of a second axial end section of the piston, wherein the second shell section is radially opposite the first outer shell section; and the wear protection layer is provided exclusively on the piston, wherein at least the force transmission surface sections of the piston are provided with the wear protection layer.

* * * * *